United States Patent [19]

Heide

[11] Patent Number: 4,759,071

[45] Date of Patent: Jul. 19, 1988

[54] AUTOMATIC NOISE ELIMINATOR FOR HEARING AIDS

[75] Inventor: Jorgen Heide, Cordova, Tenn.

[73] Assignee: Richards Medical Company, Memphis, Tenn.

[21] Appl. No.: 896,507

[22] Filed: Aug. 14, 1986

[51] Int. Cl.[4] ........................ H04R 25/00; H03B 1/04; H03G 7/00; H04B 1/10

[52] U.S. Cl. .................................... 381/68.4; 328/165; 381/47; 381/68.2; 381/71; 381/94; 381/106

[58] Field of Search ........................ 381/68.4, 68, 68.1, 381/68.2, 68.6, 68.7, 94, 106, 23.1, 47, 71; 328/165

[56] References Cited

U.S. PATENT DOCUMENTS

| | | | |
|---|---|---|---|
| 3,229,049 | 1/1966 | Goldberg | 381/68 |
| 3,928,733 | 12/1975 | Hueber | 381/68.4 |
| 4,118,604 | 10/1978 | Yanick | 381/68.2 |
| 4,151,471 | 4/1979 | Packard et al. | 328/165 |
| 4,156,116 | 5/1979 | Yanick | 381/68.2 |
| 4,185,168 | 1/1980 | Graupe et al. | 381/68 |
| 4,405,831 | 9/1983 | Michelson | 381/68.4 |
| 4,409,435 | 10/1983 | Ono | 381/68.2 |
| 4,548,082 | 10/1985 | Engebretson et al. | 381/68.6 |
| 4,628,529 | 12/1986 | Borth et al. | 381/68.2 |
| 4,630,302 | 12/1986 | Kryter | 381/68.4 |
| 4,630,305 | 12/1986 | Borth et al. | 381/68.2 |

FOREIGN PATENT DOCUMENTS

| | | | |
|---|---|---|---|
| 55-68792 | 5/1980 | Japan | 381/68 |
| 57-150300 | 9/1982 | Japan | 381/68 |

*Primary Examiner*—Jin F. Ng
*Assistant Examiner*—Danita R. Byrd
*Attorney, Agent, or Firm*—Pravel, Gambrell, Hewitt, Kimball & Krieger

[57] ABSTRACT

A noise elimination circuit, especially for a hearing aid, which removes all sound below a predetermined level and transmits a compressed sound range for all sounds above a predetermined level. The circuit uses a field effect transistor as a voltage variable resistor to transmit a signal when the sound signal is being compressed or is over a predetermined level and block the signal when the sound signal is not being compressed or is below the predetermined level. The field effect transistor drain to source resistance is varied by transmitting a signal indicative of the compression or signal level to the gate of the transistor, such that the gate voltage is higher than the source voltage when signal transfer is desired and the gate voltage is less than the source voltage when no signal transfer is desired. A switch is provided to defeat the noise elimination circuitry.

34 Claims, 2 Drawing Sheets

H2

AUTOMATIC NOISE ELIMINATOR FOR HEARING AIDS

BACKGROUND OF THE INVENTION

1. Field of the Invention

The present invention relates to noise elimination circuits in audio applications and, more particularly, to a noise elimination circuit that is adapted for use in the low voltage and small confines of a hearing aid.

2. Description of the Prior Art

Background noise is a problem for many hearing aid wearers. Speech comprehension is normally a difficult task for hearing aid wearers. The volume control of the hearing aid must be set at a level such that average or slightly above average speech levels can be properly comprehended. This volume setting allows any background noise that exists to be amplified and transmitted to the wearer. After a period of time this amplified noise greatly fatigues the wearer, which fatigue further reduces the level of comprehension of speech.

Compression techniques are used which assure that loud sounds do not cause the hearing aid to produce an output which would exceed the wearer's loudness discomfort level, but these techniques do not resolve the problem of noise levels causing fatigue because lower level sounds are still amplified and just higher level sounds compressed.

Low frequency filtering has been used in an attempt to enhance the speech over noise problem but has not been effective. A switch is used which sets the frequency range to a narrower band in one position which is used when the wearer is in a noisy environment and expands the frequency response when set to a second position for use to remove the tinny sounds resulting from the narrow bandwidth when the wearer returns to a quiet environment. This is not a satisfactory solution in many instances because speech comes in a varied number of frequencies, as does noise, and therefore some noise is amplified, some speech is lost and the amplified sounds appear highly artificial.

An alternate technique tried is the compression of low frequencies, in an attempt to remove a large amount of the environmental noise. This did not solve the problem as a significant and fatiguing quantity of noise exists in the middle and high frequency ranges. Neither the narrow bandwidth nor the low frequency solutions dealt with the overamplification problems.

SUMMARY OF THE INVENTION

The circuit of the present invention uses a novel design that is adapted for use in a small space and with relatively low power requirements and, at the same time, provides an effective noise elimination circuit which greatly reduces the fatigue of a wearer.

The sound is received by a microphone located in the hearing aid. The microphone produces a signal which is amplified using a preamplifier having an adjustable gain and transmitted to a middle and high frequency compression amplifier. The compression amplifier produces a signal which is approximately linearly amplified for input signal levels below approximately 60 db and which is compressed for input signal levels greater than approximately 60 db.

The compression amplifier output signal includes a direct current component in addition to the alternating current component comprising the audio signal. Additionally, the compression amplifier produces a direct current compression level signal which is proportional to the compression level being applied by the compression amplifier. This compression level signal is applied to the gate of a metal-oxide-semiconductor field effect transistor (MOSFET) while the compression amplifier output signal is applied to the source of the MOSFET. The drain of the MOSFET is connected through a potentiometer and filtering network to ground. The potentiometer is used as a voltage divider to supply a signal of the proper voltage to the input of an output amplifier which drives the hearing aid speaker. Alternatively, the filtering network and the potentiometer can be connected between the compression amplifier and the MOSFET source terminal, with the MOSFET drain terminal being connected to the input of the output amplifier.

The MOSFET acts as a voltage variable resistor so that when the compression portions of the compression amplifier are active and the compression level signal is a higher voltage signal, the drain to source resistance of the MOSFET is low, causing an effectively complete transmission of the compression output signal to the output circuitry and thereby an adequate signal to the wearer. As the compression level decreases because the received sound levels are lower, the resistance of the MOSFET dramatically increases because the compression level signal becomes a low voltage signal. This high channel resistance of the MOSFET greatly reduces the signal applied to the output amplifier, effectively turning it off. Therefore, the lower compression or uncompressed signals are eliminated and the fatigue to the wearer is greatly reduced.

The variable gain of the preamplifier is the noise elimination level control. By adjusting the input preamplifier gain the received sound level at which compression commences, and therefore the noise elimination threshold, can be controlled. This allows the wearer to adjust the noise threshold to the level necessary for a given environment.

It is possible to turn this noise elimination effect off in the present invention and simply have a compressed signal being amplified. This switching capability is provided by placing a capacitor between the compression amplifier output and the source of the MOSFET, thereby blocking all direct current levels produced by the compression amplifier output signal. This direct current blocking, in combination with the presence of the direct current voltage of the compression level signal results in the MOSFET always being turned on, having a low channel resistance and effectively fully passing the compressed signal. Therefore in this case, the circuit acts as an amplification and middle and high frequency compression circuit for use in relatively low noise environments.

The circuit of the present invention has relatively few parts and is simple in design, allowing it to occupy a small space and have low power requirements. These features make the circuit ideal for use in hearing aids or other devices where noise elimination circuits need to be small.

BRIEF DESCRIPTION OF THE DRAWINGS

A better understanding of the invention can be obtained when the detailed description of exemplary embodiments set forth below is considered in conjunction with the following drawings, in which.

DETAILED DESCRIPTION OF EXEMPLARY EMBODIMENTS

Figure 1:
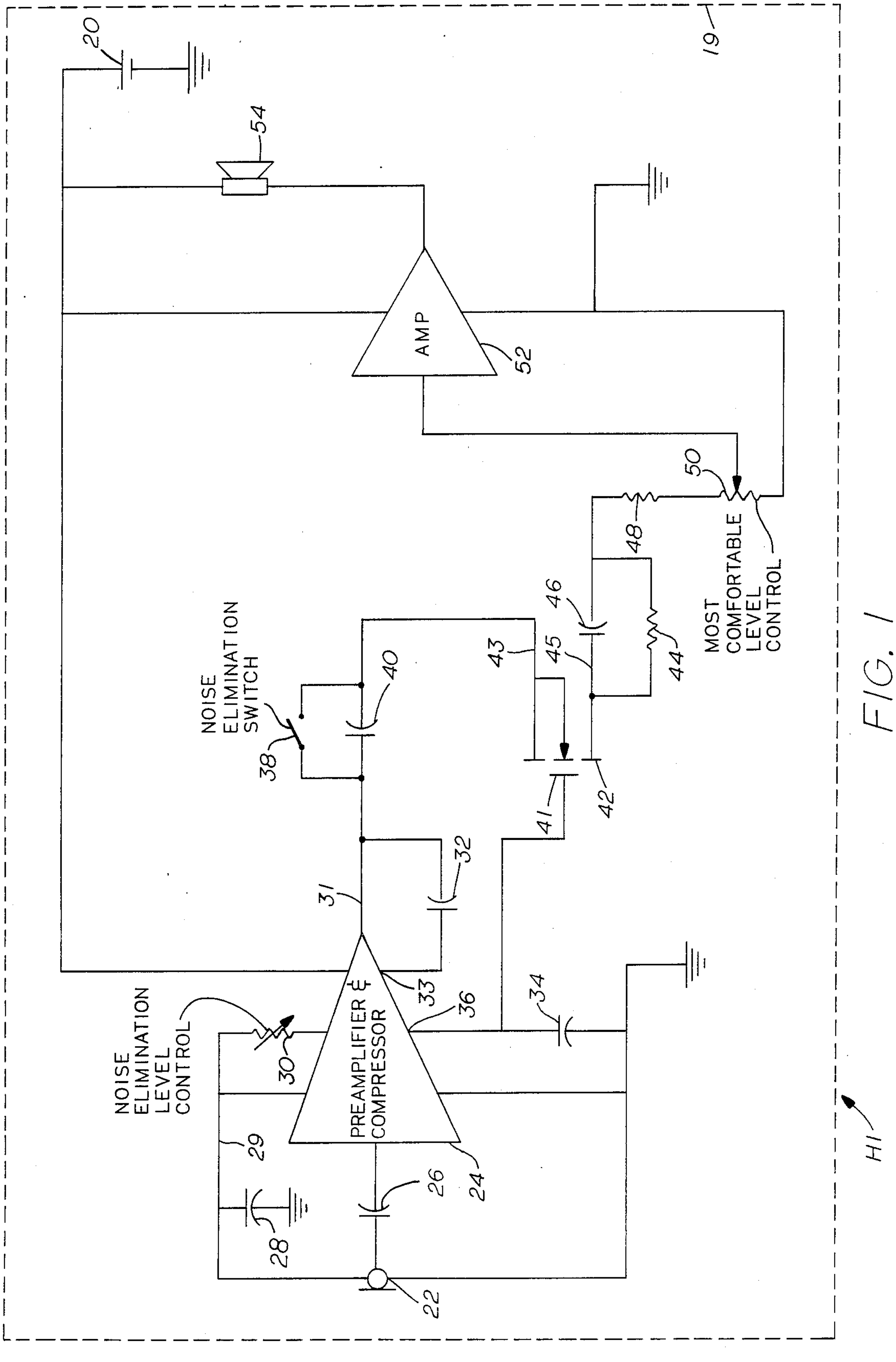
FIG. 1 is an schematic electrical circuit diagram of one embodiment of a circuit according to the present invention.

Referring to FIG. 1, the hearing aid circuit according to the present invention is generally referred by the designation H1. The components comprising hearing aid circuit H1 are contained in a small housing 19. This housing can be configured as an in-the-ear hearing aid or as a behind-the-ear hearing aid, as desired. The hearing aid circuit H1 powered by a battery 20 as is standard with hearing aid devices. The external sound waves are received by a microphone 22 of known design which transforms the sound waves into an electrical signal for use by the electronic componentry of the hearing aid. The microphone 22 is powered from a low noise supply line 29, which is filtered by a filter capacitor 28 to improve the noise levels on the supply line 29. The supply line 29 shown in FIG. 1 is connected internally (not shown) on a combined preamplifier and compression amplifier 24 with the power supply line from the battery 20.

The combined preamplifier and compression amplifier 24 is a unit having a first preamplifier stage connected to a compression amplifier, with both amplifier units being contained on the same semiconductor die. This combination of the two amplifiers on the single die reduces the space required for the electronic circuitry, which is important in hearing aid applications. The microphone 22 output signal is filtered by capacitor 26 to provide input filtering and frequency response tailoring as desired. After being filtered, the audio signal is applied to the input of the combined amplifier 24 for a first amplification by the preamplifier portion of the combined amplifier 24. The amplification level of the preamplifier stage is adjustable by varying the noise elimination level control 30. The adjustment of the noise elimination level control or variable resistor 30 will be explained in later portions of this specification. Changing the level control 30 varies the gain of the preamplifier portion and varies the signal level applied to the compression portion of the combined amplifier 24.

The compression portion of the combined amplifier 24 is used to provide a compressed output signal to eliminate the need for a volume control in the hearing aid. In a standard hearing aid, the volume control is used to vary the signal level received at the ear drum of the wearer. This use of a fixed volume control and adjustable gain level can result in overly loud and damaging signals when the wearer enters a louder or noisier environment from a quieter environment and does not change the volume or amplification level. The use of a compression amplifier solves this problem by compressing the received sound level range of 60 db to 90–100 db, or a 30–40 db input signal range, to a nominal 5–10 db output range. Because the average wearer has a 10 db comfortable listening level range, by appropriately setting the output level of the hearing aid, the compression portion then compresses all sound above given levels such that no overly loud sounds are transmitted to the wearer. The compression portion of the hearing aid circuit H1 compresses the middle and high frequency ranges of the received sounds. For sound levels below the compression threshold, the compression amplifier linearly amplifies the received signals.

The compression portion of the combined amplifier 24 produces a composite output signal having direct current and alternating current portions. The alternating current portion corresponds to the compressed audio signals, while the direct current portion is a bias voltage produced by the compression portion of the combined amplifier 24. A capacitor 32 is coupled between the combined amplifier composite output 31 and the compression control input 33. This capacitor 32 removes the direct current portion of the composite signal and feeds back only the audio or alternating current portion of the composite output signal for use in the compression determination portion of the combined amplifier 24. A capacitor 34 is connected to the compression level output 36 to provide the storage capacity required by the compression determination circuitry. The compression determination circuitry in the combined amplifier 24 senses the alternating current portion of the output and converts this signal to a direct current signal for control of the compression level being used. Capacitors 32 and 34 are the external components used in this process. The voltage of compression level signal is proportional to the compression level being applied by the compression portion of the combined amplifier 24.

The output signal from the compression portion is applied to a parallel combination of a capacitor 40 and a single pole noise elimination switch 38. When the noise elimination switch 38 is in the closed position, the noise elimination feature is activated, while when the noise elimination switch 38 is in the open position the noise elimination feature is disabled. When the switch 38 is open the composite signal is being filtered by the capacitor 40 to remove the direct current portion of the composite signal, leaving only the audio portion signal.

This parallel combination of the noise elimination switch 38 and the capacitor 40 is connected to the source 43 of a MOS field effect transistor (MOSFET) 42. The gate 41 of the MOSFET 42 is connected to the compression level output 36 for control purposes. The MOSFET 42 is operating as a voltage controlled resistor.

As the voltage applied to the gate 41 varies, the drain to source or channel resistance of the MOSFET 42 varies in an inverse proportion. As the gate voltage increases, the channel resistance decreases.

The combined amplifier output signal is a composite signal comprising a direct current voltage of approximately 0.2–0.3 volts with a low level alternating current audio signal mixed with this direct current signal. The compression level signal is a direct current signal having a magnitude of approximately 0.1 volts with reference to ground when the compression circuitry is not active and having a voltage level of approximately 0.4–0.5 volts when the compression circuitry is compressing the input signal.

In noise elimination mode, the noise elimination switch 38 is in a closed position, applying the full composite output signal to the source 43 of the MOSFET 42. Because the audio signal is a very small signal, effectively the voltage at the source 43 of the MOSFET 42 is 0.2–0.3 volts. Therefore, when the compression stage is not active, the gate 41 is at a voltage of 0.1 volts, which is less than the source voltage. Under this condition, the MOSFET 42 has a very high drain to source resistance, measuring in the hundreds of kiloohms. This high resistance of the MOSFET 42 is then used in conjunction with a voltage divider network, resistor 48 and potentiometer 50, which in a preferred embodiment are valued at 10 kiloohms each, such that the effective signal reaching the input of an output amplifier 52 is very small because of the voltage division effect, effectively an off signal level.

When the compression stage is active, the voltage on the gate 41 is approximately 0.4–0.5 volts, which is greater than the voltage on the source 43 of the MOSFET 42, thereby reducing the drain to source resistance to several hundred ohms. Because in one preferred embodiment the values of the resistor 48 and the potentiometer 50 are approximately 10 kiloohms, this drain to source resistance is relatively small and therefore has little effect on the voltage divider stage.

Therefore, it can be seen that when the compression stage is not active, and the sensed signal received by the microphone 22 is not being compressed by the combined amplifier 24, the output of the circuit is effectively zero, while when the compression stage is active, the circuit is transmitting nearly the full voltage to the voltage divider, presenting a normal output level to the wearer. Therefore, all noise or sound below a given, predetermined level is removed and all noise above a given, predetermined level is compressed and transmitted.

The noise elimination level control 30 is used to set the received sound level at which the compression circuitry begins compressing. The compression circuitry begins compressing at a fixed, predetermined signal level. The noise elimination level control 30 varies the gain of the preamplifier portion of the combined amplifier 24. Varying the gain of the preamplifier changes the output level of the preamplifier unit for a given received sound pressure. Therefore, properly varying the preamplifier gain using the noise elimination level control 30 varies the received sound pressure at which the compression portion begins compression. This allows the wearer to adjust the noise elimination level to his environment.

When the noise elimination switch 38 is in the open position, the noise elimination feature is deactivated and the voltage on the source 43 of the MOSFET 42 is in the very low region, on the order of tens of millivolts. Under this condition, the source voltage is always less than the gate voltage, and therefore the MOSFET 42 is in a conducting or low drain to source resistance mode. This is effectively turning the MOSFET 42 on at all times, therefore defeating the noise elimination characteristics of the circuit.

In this discussion of the MOSFET 42, source and drain terminals have been indicated for reference purposes, but it is to be understood that these representations are for explanatory purposes only and that the source and drain terminals can be reversed in these applications.

The drain 45 of the MOSFET 42 is connected to a parallel combination of a resistor 44 and capacitor 46. This parallel resistor-capacitor pair operates as a filter network to provide frequency filtering as desired for the hearing aid. Connected in series with this parallel pair and between the parallel pair and ground is a series combination of a fixed resistor 48 and a potentiometer 50. The potentiometer 50 and fixed resistor pair 48 are used to provide a variable level signal to the output amplifier 52. Some output level control before the output amplifier 51 is necessary because in a preferred embodiment the output amplifier 52 is a fixed gain device. The potentiometer 50 and resistor 48 act as a variable resistor-divider pair with a certain minimum division occurring at all times. Because this resistor-divider pair is located after the compression amplifier, the potentiometer 50 is referred to as the most comfortable level control and is properly set so that any signals transmitted by the hearing aid circuit H1 produce the most comfortable level for the wearer. There is no need for a wearer adjustable volume control with the presence of the compression circuitry and therefore the most comfortable level control potentiometer 50 can be set by the doctor or technician installing the hearing aid in the wearer at the level most desired by the user. When the wearer then goes into differing sound level environments, the volume produced by the speaker or output transducer 54 is then limited to a narrow level range because of the compression circuitry, this range always being within the comfortable range of the wearer, assuming that the most comfortable level control has been set to produce a level somewhere near the middle of the wearer's comfortable range.

The divided audio signal from the potentiometer 50 is transmitted to the input of the output amplifier 52 which in turn drives the speaker 54 which produces the sound waves which impinge on the wearer's eardrum, thereby producing perceived sound to the wearer.

This discussion has used a compression amplifier as a preferred embodiment as the means of providing the composite and control signals to the MOSFET. The compression amplifier described is an example of a signal level indicating amplifier which produces a composite direct current and alternating current output and a direct current signal level signal indicative of the input alternating current signal levels. Such a signal level indicating amplifier could also be used with the MOSFET and operate according to the present invention.

Figure 2:
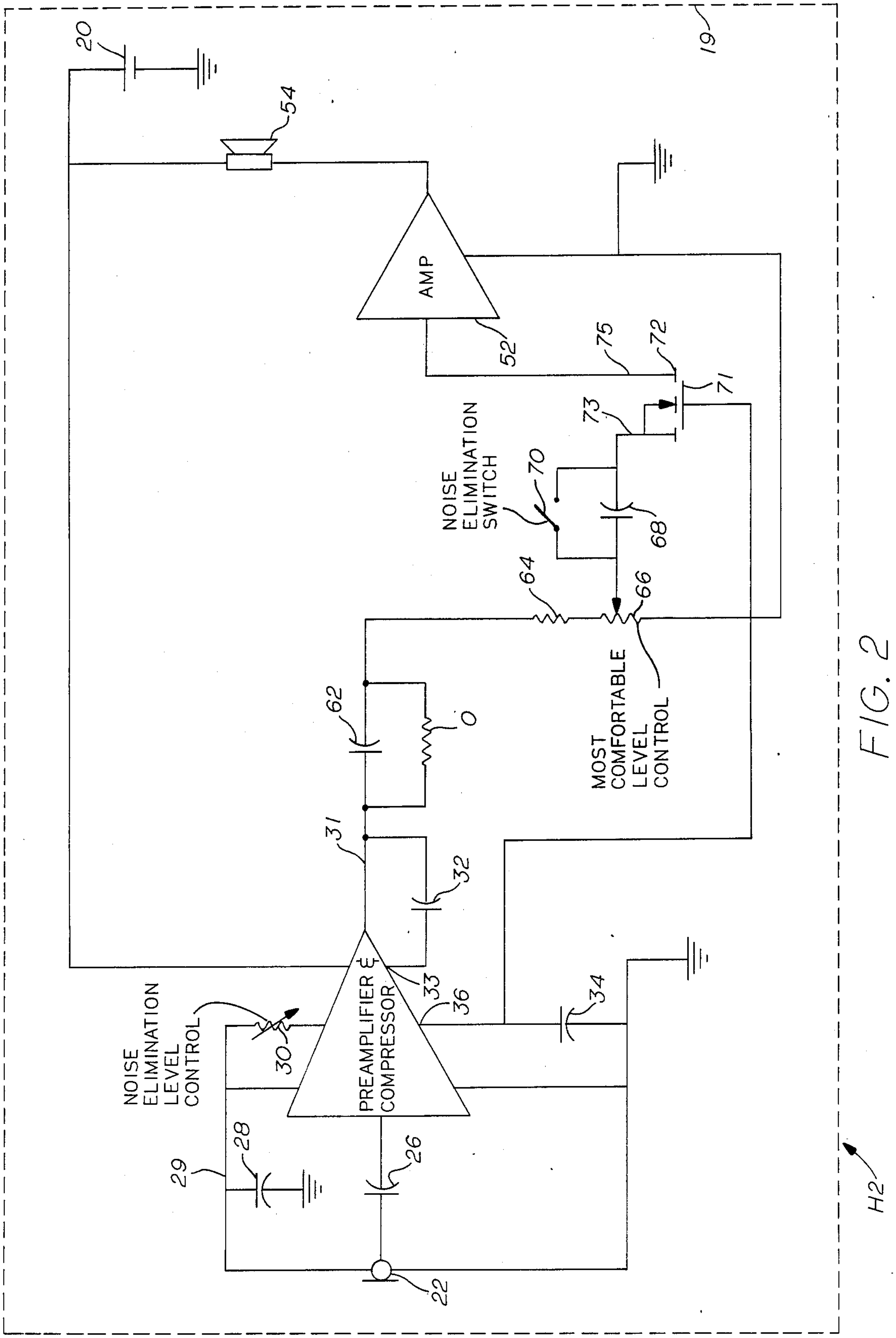
FIG. 2 is a schematic electrical circuit diagram of a second embodiment of a circuit designed according to the present invention.

FIG. 2 shows an alternate embodiment of the noise elimination circuitry wherein the MOSFET 72 and noise elimination switch 70 and capacitor 68 pair have been moved to a location after the most comfortable level control potentiometer 66. In FIG. 2, like elements with FIG. 1 bear a like reference member. This embodiment works based on the same principles as the embodiment of FIG. 1, with a difference in that the voltage levels are changed to reflect the different position of the MOSFET 72.

A parallel resistor 60 and capacitor 62 are connected to the composite signal output 31 of the combined amplifier 24, to provide frequency filtering as desired. The filter network is connected to a series fixed resistor 64 and potentiometer 66 which are connected to ground and form a variable voltage divider network. This voltage divider network performs the most comfortable level control function.

The variable arm of the potentiometer 66 is connected through a noise elimination switch 70 and blocking capacitor 68 to the source 73 of a MOSFET 72. The switch 70 and capacitor 68 operate similarly to the similar switch 38 and capacitor 40 to enable and disable the noise elimination feature.

The gate 71 of the MOSFET 72 is connected to the compression level output 36 to provide channel resistance control. The drain 75 is connected to the input of the output amplifier 52, which amplifies the received signal and transmits the sounds by means of the speaker 54. When the compression circuitry is active the signal appearing at the gate 71 is greater than the source voltage, causing the MOSFET 72 to be on and the compressed signal is transmitted to the output amplifier 52. When the compression circuitry is inactive, the gate voltage is less than the source voltage and the MOSFET 72 blocks the signal going to the output amplifier 52, providing the noise elimination feature.

The foregoing disclosure and description of the invention are illustrative and explanatory of the invention, and various changes in the size, shape, and materials, as well as in details of the illustrated construction may be made without departing from the spirit of the invention, all of which are contemplated as falling within the scope of the appended claims.

I claim:

1. A hearing aid, comprising:

a housing;

a sound sensing means located in said housing for forming a signal output in response to sound;

a sound producing means located in said housing for forming sound in response to a signal input;

compression means located in said housing and having a signal input, a compressed signal output and a compression level signal output;

said signal input of said compression means receiving said sound sensing means signal output;

a field effect transistor having a gate, a source, and a drain and being located in said housing, said gate receiving said compression means compression level signal output, said source receiving said compression means compressed signal output and a field effect transistor output signal being transmitted by said drain;

an output amplifier means located in said housing and having a signal input and an amplified signal output, said output amplifier means signal input receiving said field effect transistor output signal; and said sound producing means signal input receiving said output amplifier means amplified signal output.

2. The hearing aid of claim 1, wherein the compression means compression level signal comprises a direct current portion and the compression means compressed signal comprises direct and alternating current portions.

3. The hearing aid of claim 2, wherein the direct current portion of the compressed signal is less than the direct current portion of the compression level signal when compression is occurring.

4. The hearing aid of claim 3 wherein the direct current portion of the compressed signal is greater than the direct current portion of the compression level signal at times other than when compression is occurring.

5. The hearing aid of claim 4, wherein the field effect transistor source is selectively capacitively coupled to said compression means compressed signal output.

6. The hearing aid of claim 5, wherein the field effect transistor output signal is transmitted to said output amplifier means signal input through a variable voltage divider network for varying the level of the signal at said output amplifier means signal input.

7. The hearing aid of claim 5, wherein said field effect transistor source receives the compression means signal output through a variable voltage divider network.

8. The hearing aid of claim 2, wherein said field effect transistor source is selectively capacitively coupled to said compression means compressed signal output.

9. The hearing aid of claim 2, wherein the direct current portion of the compressed signal is greater than the direct current portion of the compression level signal at times other than when compression is occurring.

10. The hearing aid of claim 1, wherein said compression means further includes preamplification means for amplifying the signal input to said compression means.

11. The hearing aid of claim 10, wherein the gain of said preamplification means is adjustable.

12. The hearing aid of claim 1, wherein said field effect transistor is a metal-oxide-semiconductor field effect transistor.

13. The hearing aid of claim 1, wherein the field effect transistor output signal is transmitted to said output amplifier means signal input through a variable voltage divider network for varying the level of the signal at said output amplifier means signal input.

14. The hearing aid of claim 1, wherein said field effect transistor source receives the compression means signal output through a variable voltage divider network.

15. A hearing aid, comprising:

a housing;

a sound sensing means located in said housing for forming a signal output in response to sound;

a sound producing means located in said housing for forming a sound in response to a signal input;

signal level indication means located in said housing and having a signal input, a composite signal output, and a signal level signal output, said signal level indication means signal input receiving said sound sensing means signal output;

said signal level indication means forming a composite signal comprising direct and alternating current portions, said direct current portion being greater than said alternating current portion, and a signal level signal comprising a direct current portion;

a field effect transistor located in said housing and having a gate, a source, and a drain, said gate receiving said signal level indication means signal level signal output, said source receiving said signal level indication means composite signal output and a field effect transistor output signal being transmitted by said drain;

an output amplifier means located in said housing and having a signal input and an amplified signal output, said output amplifier means signal input receiving said field effect transistor output signal; and said sound producing means signal input receiving said output amplifier means amplified signal output.

16. The hearing aid of claim 15, wherein the direct current portion of the composite signal is less than the direct current portion of the signal level signal when a signal level greater than a predetermined amount is present at the signal level indication means signal input.

17. The hearing aid of claim 16, wherein the direct current portion of the composite signal is greater than the direct current portion of the signal level signal when a signal less than a predetermined amount is present at the signal level indication means signal input.

18. The hearing aid of claim 17, wherein said field effect transistor source is selectively capacitively coupled to said signal level indication means composite signal output.

19. The hearing aid of claim 18, wherein said field effect transistor output signal is transmitted to said output amplifier means signal input through a variable voltage divider network.

20. The hearing aid of claim 18, wherein said field effect transistor source receives said signal level indication means composite signal output through a variable voltage divider network.

21. The hearing aid of claim 15, wherein said field effect transistor source is selectively capacitively coupled to said signal level indication means composite signal output.

22. The hearing aid of claim 15, wherein said signal level indication means further includes preamplification means for amplifying the signal input to said signal level indication means.

23. The hearing aid of claim 22, wherein the gain of said preamplification means is adjustable.

24. The hearing aid of claim 15, wherein said field effect transistor output signal is transmitted to said output amplifier means signal input through a variable voltage divider network.

25. The hearing aid of claim 15, wherein said field effect transistor source receives said signal level indication means composite signal output through a variable voltage divider network.

26. The hearing aid of claim 15, wherein the field effect transistor is a metal-oxide-semiconductor field effect transistor.

27. The hearing aid of claim 15, wherein the direct current portion of the composite signal is greater than the direct current portion of the signal level signal when a signal less than a predetermined amount is present at the signal level indication means signal input.

28. A noise elimination circuit having an input and an output, comprising:

signal level indication means having a signal input, a composite signal output and a signal level signal output, said signal input forming a noise eliminator circuit input, said signal level indication means forming a composite signal comprising direct and alternating current portions, said direct current portion being greater than said alternating current portion, and a signal level signal comprising a direct current portion; and a field effect transistor having a gate, a source and a drain, said gate receiving the signal level indication means signal level signal output, said source receiving the signal level indication means signal output, and said drain forming a noise eliminator circuit output.

29. The noise eliminator circuit of claim 28, wherein said field effect transistor is a metal-oxide-semiconductor field effect transistor.

30. The noise elimination circuit of claim 28, wherein the direct current portion of the composite signal is less than the direct current portion of the signal level signal when a signal level greater than a predetermined amount is present at the signal level indication means signal input.

31. The noise elimination circuit of claim 30, wherein the direct current portion of the composite signal is greater than the direct current portion of the signal level signal when a signal level less than a predetermined amount is present at said signal level indication means signal input.

32. The noise elimination circuit of claim 31, wherein said field effect transistor source is selectively capacitively coupled to said signal level indication means composite signal output.

33. The noise elimination circuit of claim 28, wherein said field effect transistor source is selectively capacitively coupled to said signal level indication means composite signal output.

34. The noise elimination circuit of claim 28, wherein the direct current portion of the composite signal is greater than the direct current portion of the signal level signal when a signal level less than a predetermined amount is present at said signal level indication means signal input.

* * * * *